United States Patent [19]

Garrett et al.

[11] 4,346,309
[45] Aug. 24, 1982

[54] CONTROLLABLE RECTIFIER CIRCUIT

[75] Inventors: John M. Garrett; Kenneth G. King, both of Chippenham, England

[73] Assignee: Westinghouse Brake and Signal Co., Ltd., Chippenham, England

[21] Appl. No.: 113,190

[22] Filed: Jan. 18, 1980

[30] Foreign Application Priority Data

Jan. 23, 1979 [GB] United Kingdom ............... 7902378
May 15, 1979 [GB] United Kingdom ............... 7916812

[51] Int. Cl.³ .......................................... H03K 17/72
[52] U.S. Cl. ......................... 307/252 M; 307/252 N; 307/305; 324/158 SC; 363/138
[58] Field of Search .......... 307/252 M, 252 N, 252 Q, 307/305; 324/158 SC; 363/138

[56] References Cited

U.S. PATENT DOCUMENTS 3,638,042 1/1972 Studtmann .................... 307/305 X

Primary Examiner—John Zazworsky
Attorney, Agent, or Firm—Larson and Taylor

[57] ABSTRACT

When the forward load current through a thyristor is commutated it does not immediately recover its availability to block forward current flow due to re-applied forward voltage, the time taken for this blocking ability to return is known as the thyristor turn-off time. Hitherto a low valued current has been passed through the thyristor immediately after commutation in the reverse direction to achieve reduction of the turn-off time. The present invention operates to achieve a greater reduction of the turn-off time by passing a low-valued current through the thyristor in a forward direction immediately after commutation. Several alternative circuit arrangements and operating configurations for supplying the forward recovery current are described.

8 Claims, 11 Drawing Figures

Fig. 1

CURRENT AND VOLTAGE AT TURN-OFF USING A RECOVERY GENERATOR

NORMAL TURN-OFF CONDITIONS FOR CIRCUIT SIMILAR TO FIG.1 BUT 7, 8 AND RECOVERY GENERATOR OMITTED.

CONTROLLABLE RECTIFIER CIRCUIT

The invention relates to thyristor control circuits and particularly to improvements therein to enhance turn-off performance.

A thyristor or SCR (silicon controlled rectifier) can be turned-off by reducing current flow through the device to less than the holding current but the device does not immediately recover its ability to block applied forward voltages until stored charges in the semiconductor regions have returned sufficiently towards equilibrium conditions. Hitherto this period of delay, known as the turn-off time, has been reduced by application of a reverse voltage across the device. This reverse bias recovery mode operates by depleting current carriers primarily in the region of the reverse blocking junction, in many devices carriers in this region already possess almost minimum carrier lifetime and so removal of external carriers cannot substantially improve the turn-off time.

It is an object of the present invention to achieve a reduction in the turn-off time of a thyristor by depleting the current carrier density in the region of the main forward blocking junction. This is achieved by supplying the thyristor with a low value forward current which, distributed evenly across the emitter, results in insufficient current density to cause carrier injection and thus assists the device in recovering its blocking capability.

According to the present invention there is provided a controllable rectifier circuit comprising a controllable rectifier device capable of blocking forward current flow in a load current path through the device and current source means operatively connected to supply a rectifier blocking recovery assisting current having a forward current value less than a value capable of holding the device in a forward conduction state and arranged to be operatively triggered in response to forward current through the device falling to a value below a threshold value, equal to or less than the forward holding current value.

In one form of the invention, the blocking recovery assisting current comprises a low value d.c. forward current and in another form comprises an alternating current having alternating low value forward current and low value reverse current components.

A thyristor turn-off time increases approximately as the square of its voltage rating. Hitherto therefore, where the voltage rating of a thyristor has been incompatible with the desired achievable turn-off time, it has been necessary to use two thyristors having the desired turn-off time capability connected in series. This arrangement possessed the disadvantage that the series thyristors had to be matched in respect of other characteristics such as turn-on delay, rise time and quantity of stored charges. A circuit embodying the present invention may provide an alternative insofar as it will permit the turn-off time of a sufficiently highly voltage rated thyristor to be reduced in operation to the desired level.

Also, as longer turn-off times require correspondingly larger valued components in thyristor commutating circuits, the ensuing increased costs due, for example, to the higher cost and physically larger volumes of larger valued capacitors are obviated by the shortening of turn-off times.

In order that the invention may be clearly understood and readily carried into practice, the invention will now be described, by way of example, with reference to the embodiments shown in the accompanying drawings in which.

Figure 1:
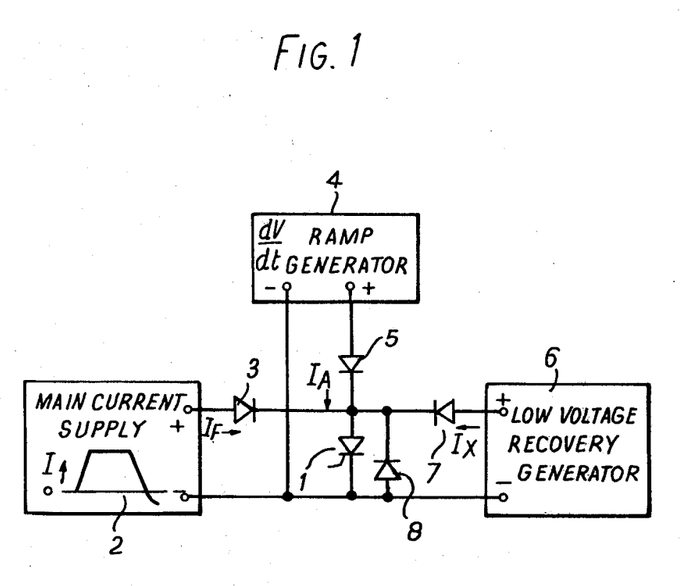
FIG. 1 shows a schematic diagram of a thyristor turn-off time test circuit.

The circuit of FIG. 1 is a thyristor test circuit employed to verify that newly manufactured thyristors meet their performance specification. However, the principle of that part of the circuit embodying the invention will be seen to be directly applicable to, and of immediate value in, many other thyristor control circuits. Essentially, such a test circuit is a control circuit adapted to operate a thyristor at, or close to, its maximum performance parameters. It will be readily appreciated, with the help of the following description, how the relevant part of the test circuit may be carried directly over to a practical control circuit.

As has already been mentioned above, it is an object of the invention to apply a brief period of low forward current to a thyristor under test before the circuit reapplies full forward voltage. A forward current from a low voltage source is circulated through the device in the interval immediately following main current commutation. This forward current substantially replaces the normal reverse recovery current, or stored charge current, flowing in the opposite direction. Referring now to FIG. 1, the thyristor 1 under test is connected to a commutated main current supply circuit 2 through a series-connected forward conduction diode 3. In addition, a critical dV/dt ramp voltage generator 4 is also connected across the terminals of thyristor 1 through a further series-connected forward conduction diode 5, and a further low voltage forward current source means generator 6 is connected across the thyristor through another forward conduction diode 7. An anti-parallel diode 8 can be connected in the circuit as shown, to limit reverse voltages across thyristor 1 and thus protect the low voltage generator 6 during the commutation interval.

Figure 2:
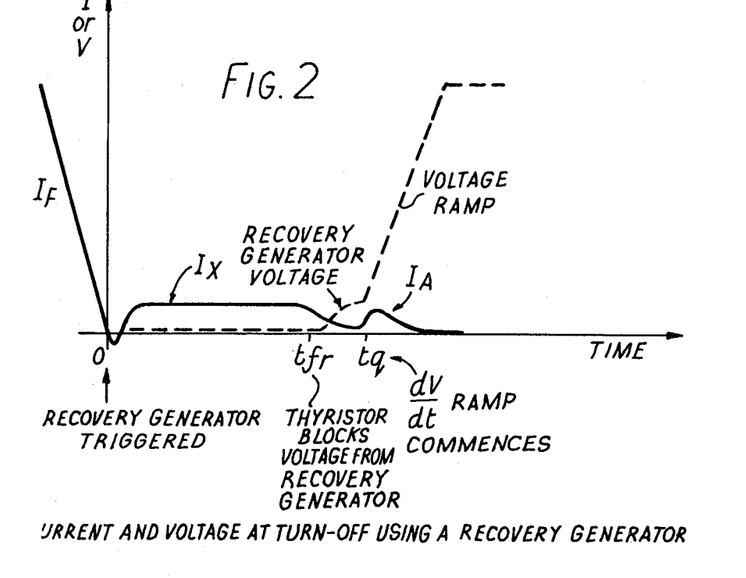
FIG. 2 shows thyristor voltage and current curves produced in the test circuit of FIG. 1.

The voltage across thyristor 1 and the current through it during a typical cycle of the FIG. 1 test circuit are shown in FIG. 2. Initially, the thyristor 1 is rendered conducting and the main supply 2 is commutated, as in a normal turn-off test. As the forward current $I_F$, the solid line in FIG. 2, passes through a threshold value, here zero, the current source generator 6 is operatively triggered and begins to pass a forward current $I_x$ through the thyristor. The voltage across the thyristor is represented by the dashed line in the drawings. The value of $I_x$ is current-limited at a value lower than the thyristor holding current value in the particular circuit employed. After a short time interval, at time $t_{fr}$, the thyristor commences to block current from the recovery generator 6. The current then begins to fall to a very low value, determined by the thyristor leakage current and the current source generator output voltage rises towards its off-load value. Shortly after this, the dV/dt ramp voltage generator 4 is triggered and at time $t_q$ starts to produce a voltage ramp in a forward sense applied to the thyristors. The current $I_A$ through the thyristor 1 in the interval immediately following $t_q$, momentarily increases as the space charge regions in the device readjust to the new bias conditions. However, providing the forward blocking junction has sufficiently recovered, the device does not breakover into forward conduction and the momentarily increased current $I_A$ falls back to virtually zero. Assuming that the device has recovered its blocking capability, that is, that the voltage ramp is not applied too soon, any ramp having a dV/dt positive rate of change, equal to or less than a critical value will be successfully blocked.

Figure 3:
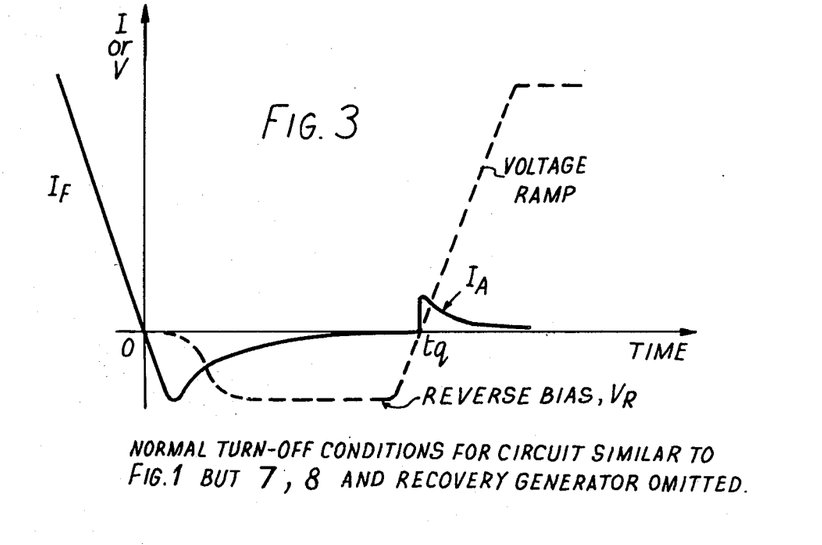
FIG. 3 shows thyristor voltage and current curves produced in a conventional test circuit.

FIG. 3 shows, for contrast, voltage and current curves obtained for the same device, subject to normal turn-off conditions. Such a test circuit could be realised in FIG. 1 by omitting the forward voltage recovery generator 6 and associated diode 7 and diode 8. The anti-parallel diode 8 would need to be omitted, since it would otherwise short circuit the reversed voltage from the main current supply 2. Initially, a substantial reverse current flows, holding the generator reverse voltage to a very low value, the source of the current being charge carriers from the vicinity of the two end junctions. The reverse current falls towards zero as the concentration of current carriers is reduced and the reverse voltage correspondingly builds-up towards its limit value. At a subsequent instant $t_q$, when the reverse current has fallen to substantially zero, forward bias from the voltage ramp generator is applied to the device, accompanied by a momentary resurgence of forward current which decays back to zero if the device has recovered its blocking capability.

In the practical example being described, the forward blocking recovery assisting current $I_x$ was set at a value approximately 20% below the thyristor holding current. Under such conditions, it was found that the turn-off time was approximately 30% shorter than that obtained without forward recovery assisting current $I_x$ or with a typical reverse recovery voltage, say 50 v. Furthermore, it was also found that the earliest time $t_q$ at which the test voltage ramp could be applied was almost coincidental with the instant of thyristor voltage blocking recovery $t_{fr}$, thus giving $t_q$ a critical value, $t_q$ crit. It was found that the peak value of $I_A$, in FIG. 2, achieved at the point at which the thyristor just succeeded in turning-off, was marginally in excess of the plateau value of $I_x$. In contrast to this observation, it was noted that under the conditions relating to FIG. 3, the corresponding critical transient value of $I_A$ was higher, but that the minimum value of time $t_q$ achieved was approximately 40% longer than achieved under the conditions of FIG. 2.

Figure 4:
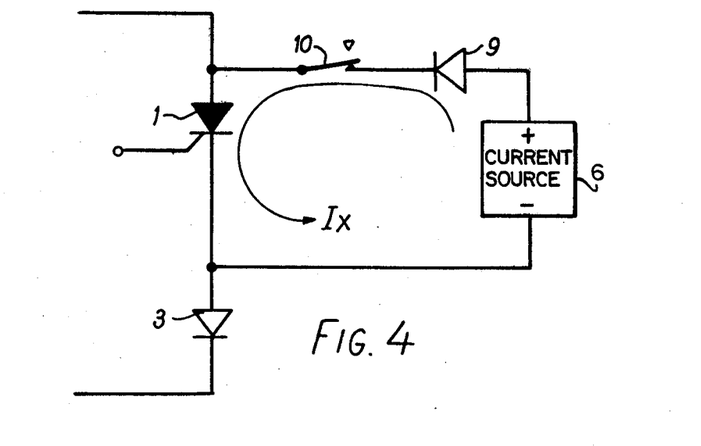
FIGS. 4 and 5 show alternative circuit connections for a forward recovery voltage generator.
Figure 5:
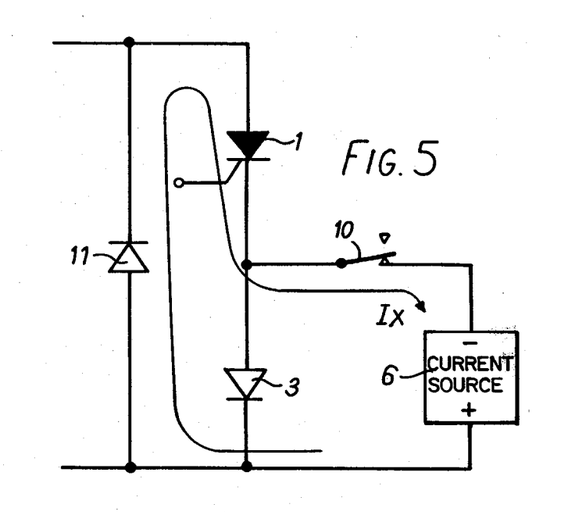

FIGS. 4 and 5 illustrate alternative practical arrangements for connecting forward blocking recovery assisting current source means, generator 6 to supply forward current to the thyristors 1. In FIG. 4, thyristor 1 is connected in series with forward conduction diode 3 (alternatively referred to as a reverse current blocking diode) and the generator 6, its output terminals sensed as shown, is connected between the anode and cathode terminals of the thyristor through a further forward conduction diode 9 and an electronic switch 10. Closing of the switch 10 is controlled by a control circuit (not shown) responsive to commutation of the normal load current carried by thyristor 1. The forward recovery current $I_x$ flows in the loop path indicated when the switch 10 is closed.

In FIG. 5, in which like parts are given like references, the generator 6 is connected in parallel with diode 3, through switch 10, with its voltage terminals sensed as shown. In addition, an anti-parallel diode 11 is connected across thyristor 1 and series diode 3 to provide a path for forward current $I_x$ as shown, when switch 10 is closed.

Figure 6:
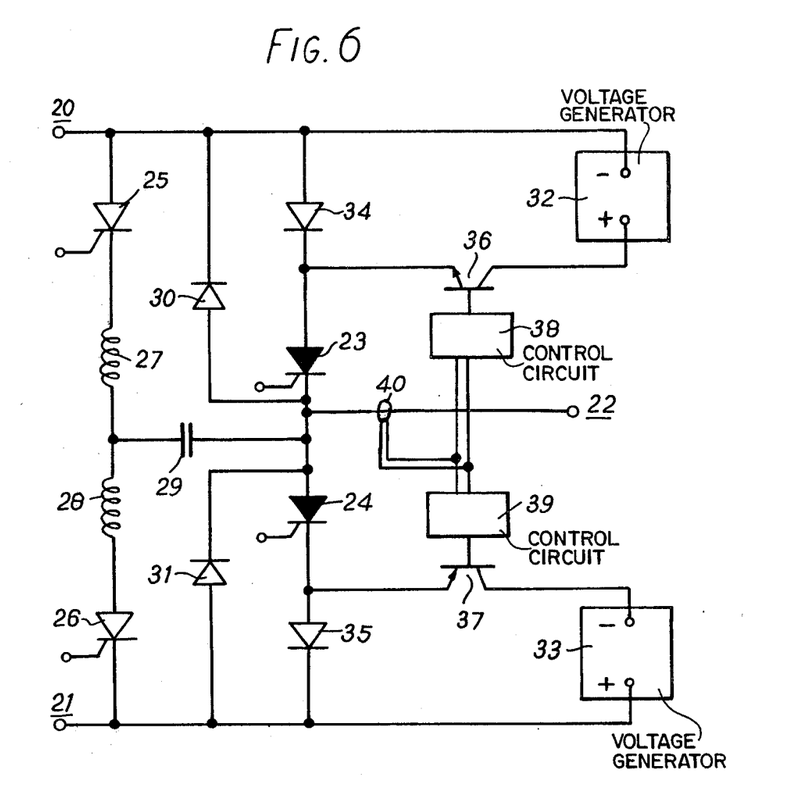
FIG. 6 shows a practical form of single-phase a.c. inverter employing the invention.

FIG. 6 shows the basic arrangement of FIG. 5, used in a practical form of full-wave single-phase a.c. inverter wherein a d.c. supply voltage is connected between terminals 20, 21 and the load to be supplied with a.c. voltage is connected to load terminals 22, and the return path (not shown) for the load current is connected either to the corresponding point of a complementary synchronous circuit or, to the centre (zero voltage) point of the d.c voltage power supply connected between terminals 20 and 21. The main thyristors 23, 24 are commutated by gating the appropriate commutating thyristor 25, 26. The inductors 27, 28 each form a resonant circuit with commutating capacitor 29 such that when one of the thyristors 25, 26 is triggered, a resonant current pulse is applied initially in opposition to the load current through the corresponding main thyristors 23, 24. When the main thyristor current is reduced to zero, the respective anti-parallel diode 30, 31 carries the resonant current pulse. In a conventional circuit, the diodes 30, 31 provide, as appropriate, a small reverse voltage across the main thyristors 23, 24 which assists the thyristor in recovery of its blocking capability. The time taken for the thyristors 23, 24 to recover their blocking capability sets an upper limit to the inverter-operating frequency.

In FIG. 6, a forward current is passed through thyristors 23, 24, in the manner of FIG. 5, to assist blocking recovery. Low voltage generators 32, 33, typically 4 volts sensed as shown in the drawing, are connected in parallel with diodes 34, 35 in series with thyristors 23, 24, respectively. The generators 32, 33 are operatively triggered, that is, switched in and out of circuit, respectively, by means of current switching transistors 36, 37 controlled by control circuits 38, 39, responsive to a common triggering signal generated by current transformer 40 which has its primary winding connected in series with the load. The control circuits 38, 39 are provided internally with reference level means set to produce reference signals corresponding to a load current threshold value. Thus, in operation, when a load current through either half circuit falls to the relevant threshold level, the corresponding current source means is operatively triggered, by switching either transistor 36 or 37 to a conducting state, to supply blocking recovery assisting current to either thyristor 23 or 24 respectively. The reduction in thyristor recovery time thus achieved can directly be contributed to provide a significant increase in the commutating frequency.

The inverter of FIG. 6 is shown incorporating a recovery circuit of the type illustrated in FIG. 5, and operating in accordance with FIG. 2. However, it will be appreciated that further circuits such as those illustrated in FIGS. 10 and 11 and/or circuits operating in accordance with FIGS. 7, 8 and 9 may be alternatively employed in the inverter.

Figure 7:
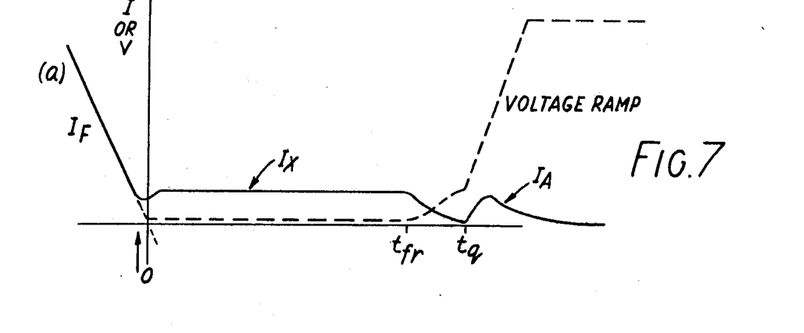
FIGS. 7, 8 and 9 show voltage and current curves produced by recovery voltage generators with advanced triggering, delayed triggering and alternating output voltage respectively.
Figure 8:
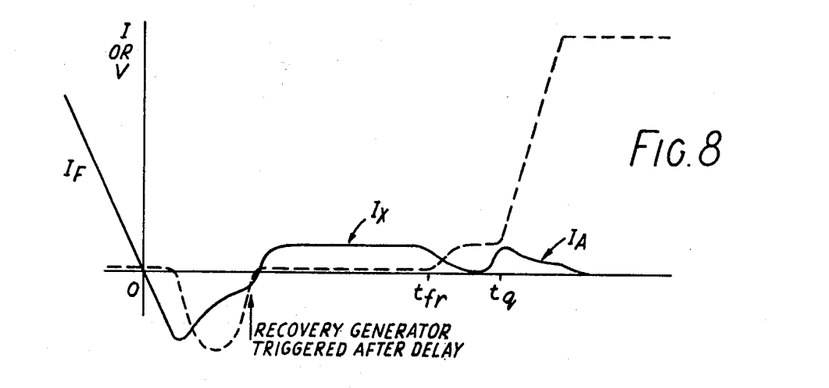
Figure 9:
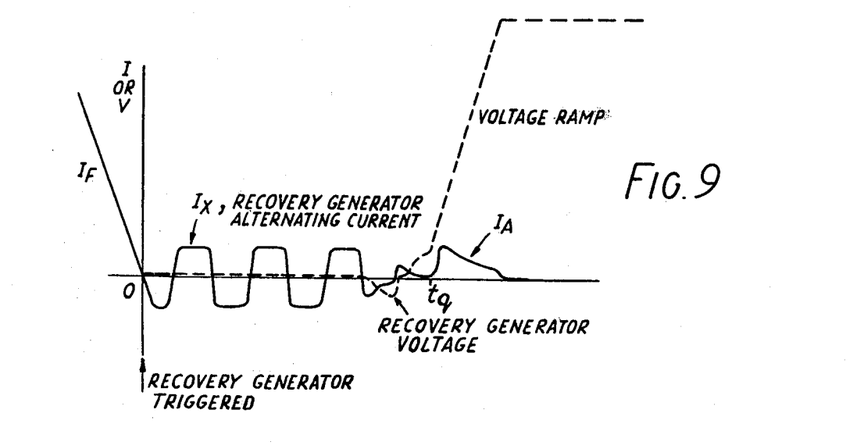

Further embodiments of the invention employ forward voltage recovery generators having alternative operating modes, three of which are illustrated by means of voltage and current curves in FIGS. 7, 8 and 9, respectively.

In the arrangement illustrated by FIG. 7, the recovery generator is triggered ahead of the actual commutation time of the anode current, the triggering point could be chosen at any desired voltage level but, given the operating characteristics of the generator as above, it is convenient to trigger the generator at the moment or subsequent to when a falling forward anode current passes through the forward holding current level. In FIG. 7, triggering is carried out at, or very close to, the holding level so that the thyristor current $I_x$ does not fall completely to zero. However, the same recovery mechanism takes place commencing as soon as the thyristor bias conditions can no longer sustain normal conduction conditions to restore thyristor reverse blocking capability.

In the arrangement relating to FIG. 8, the recovery generator produces its output after a delay commencing at the selected triggering point. During the delay period immediately following current commutation, conventional reverse current recovery conditions can be permitted, thus, in FIG. 1 for example, diode 8 would be omitted preferably, otherwise the reverse current would be restricted to a low value determined by the conduction voltage drop of diode 8.

A further alternative arrangement uses a recovery generator producing alternately forward and reverse currents, an example of typical voltage and current curves for such an arrangement is shown in FIG. 9. Circumstances may occur with certain devices where recovery time cannot be minimised using either forward or reverse recovery current alone because of the construction of the thyristor. The initially applied recovery current may be of either polarity, although reverse current is shown initially in FIG. 9, no general advantage has been recognised and empirical observations have shown no general advantage in either case, with individual devices however minimal improvements may be achieved. With a recovery generator having an alternating output voltage, after an interval of time and before $t_q$, blocking of the recovery signal in at least the forward bias direction will become apparent. Depending on the construction method used in manufacture of the thyristor 1 reverse blocking capability may also become apparent before, after or as shown in FIG. 9, almost simultaneously with forward blocking capability.

Figure 10:
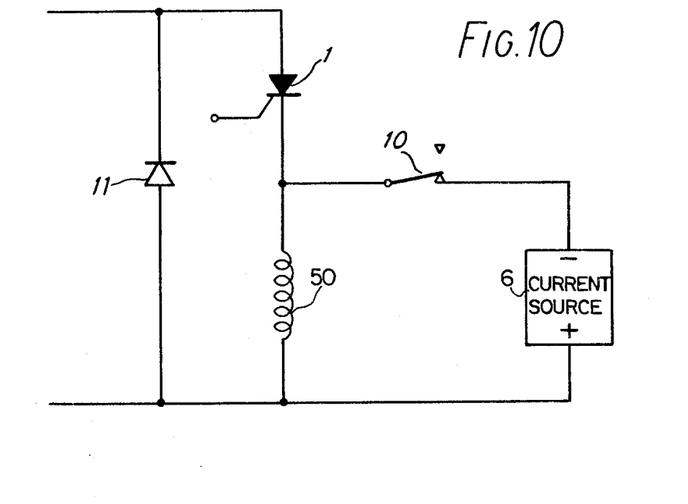
FIGS. 10 and 11 show two further alternative circuit connections for a forward recovery voltage generator.

In FIGS. 2, 7, 8 and 9 the time $t_{fr}$ signifies the point at which resumption of the forward blocking capability of a thyristor commences, a very short time thereafter it is safe to re-apply full forward load voltage. The point $t_{fr}$ also marks the end of the plateau in the blocking recovery assisting current $I_x$ so that a further trigger point, after which forward load voltage may be applied, can be derived by searching for, say, a predetermined percentage fall in the instantaneous value of $I_x$. A sensing circuit operating in this manner, and optionally incorporated in the $I_x$ current limiting circuit in the current source means, can be used to provide a signal by means of which load voltage inhibiting means may be controlled so as to prevent reapplication of load voltage until the thyristor has recovered forward blocking capability. For example in FIG. 1 such a control could be used to inhibit operation of the dV/dt ramp generator 4. Use of such a circuit enables $t_q$, the time at which forward load voltage can safely be applied, to approach and even coincide with the time $t_{q\ crit}$. Therefore a load voltage inhibiting circuit interlocked as described with the thyristor recovery assisting current source means may be used either, as a safety circuit operative to limit to a minimum the period between load current commutation and re-application of load voltage thereby effectively limiting commutation frequency to a maximum value or, as a frequency control signal, for example in an inverter circuit, which will produce continuous safe operation at the maximum permissible frequency. The current source arrangements of FIGS. 4 and 5 have reverse current blocking diodes connected in the thyristor load current path which effectively block reverse current during the thyristor recovery period. The recovery assisting forward current configuration of FIG. 5 may also be employed with the circuit arrangements illustrated in FIGS. 10 and 11 where like parts have the same references. In FIG. 10 a saturable reactor 50 is connected in series with thyristor 1, in place of diode 3. Reactor 50 has a low winding resistance and is magnetically arranged such that under normal load current conditions it saturates in the forward current direction. The reactor 50 will behave as a low impedance to current in the forward or load current direction and as a high impedance to currents in the opposite direction, until such time as the reactor core becomes saturated in the opposite direction. Thus, the forward recovery current from generator 6 follows the same path as shown in FIG. 5. The magnetic characteristics of reactor 50 are designed to provide a longer resaturation time under the prevailing circuit current conditions than that for which the thyristor forward recovery current is expected to flow.

Figure 11:
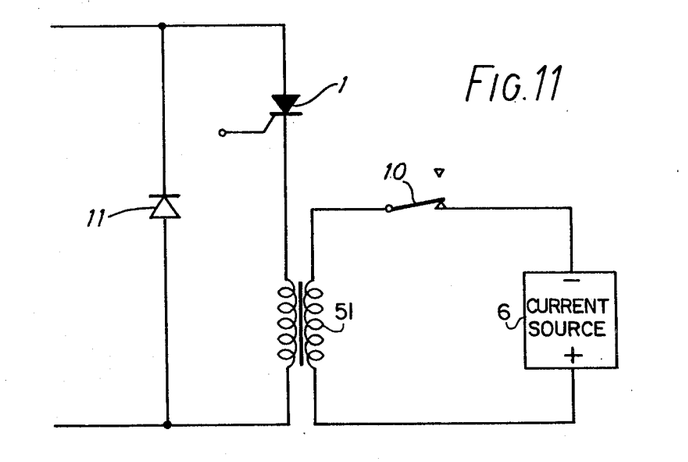

The FIG. 11 arrangement operates essentially in the same way as that of FIG. 10, using a saturable transformer 51 in place of saturable reactor 50.

Either the FIG. 10 or FIG. 11 arrangement may be used, for example, to inject the alternating recovery current of FIG. 9 into a thyristor recovery current circuit. Providing the anti-parallel diode 11 is carrying sufficient total forward current, a current component of either forward or reverse sense may be made to flow through thyristor 1 by means of the output of generator 6. In this mode of operation, diode 11 may be considered as a current gating diode and must be "gated on", to permit alternating current flow, by means of a further current source (not shown) if necessary.

It is to be understood that the described circuit and current arrangement are not exhaustive and serve to illustrate ways by which the invention can be carried into practice.

Having thus described our invention what we claim is:

1. A controllable rectifier circuit comprising a controllable rectifier device capable of blocking forward current flow in a load current path through the device; current source means, operative in response to a trigger signal, for passing a blocking recovery assisting current in a forward sense through the device; and current sensing means for sensing the level of load current through the device and producing the said trigger signal for the current source in response to the load current falling below a threshold value equal to or less than the forward holding current of the device, the blocking recovery assisting current produced by the current source means being equal to or less than the forward holding current so as to deplete the current carrier density in the region of the forward blocking junction of the device and thereby reduce the turn-off time thereof.

2. A controllable rectifier circuit according to claim 1 wherein the blocking recovery assisting current in a forward sense alternates with current in a reverse sense.

3. A controllable rectifier circuit according to claim 1 wherein the current source means is connected in parallel with the controllable rectifier device to form a closed loop path for the blocking recovery assisting current.

4. A controllable rectifier circuit according to claim 3, wherein a reverse current blocking diode is connected in series with the parallel combination of a rectifier device and the current source means.

5. A controllable rectifier circuit according to claim 1, wherein the current source means is connected in series with the controllable rectifier device and an antiparallel diode is connected in parallel with the series combination of rectifier device and current source means to form a closed loop path for the blocking recovery assiting current.

6. A controllable rectifier circuit according to claim 5, wherein the current source means comprises current supply means connected in parallel with reverse current blocking diode means.

7. A controllable rectifier circuit according to claim 5, wherein the current source means comprises a saturable transformer having a first winding connected in series with the rectifier device and a current supply means connected in circuit with a second winding of the transformer.

8. A controllable rectifier circuit according to claim 5, wherein the current source means comprises a saturable reactor connected in series with the rectifier device and a current supply means connected in parallel with the reactor.

* * * * *